United States Patent
Liu et al.

(10) Patent No.: US 7,202,164 B2
(45) Date of Patent: Apr. 10, 2007

(54) METHOD OF FORMING ULTRA THIN SILICON OXYNITRIDE FOR GATE DIELECTRIC APPLICATIONS

(75) Inventors: Jinping Liu, Beacon, NY (US); Hwa Weng Koh, Beacon, NY (US); Dong Kyun Sohn, Singapore (SG); Liang Choo Hsia, Singapore (SG)

(73) Assignee: Chartered Semiconductor Manufacturing Ltd., Singapore (SG)

(\*) Notice: Subject to any disclaimer, the term of this patent is extended or adjusted under 35 U.S.C. 154(b) by 62 days.

(21) Appl. No.: 10/992,894

(22) Filed: Nov. 19, 2004

(65) Prior Publication Data

US 2006/0110865 A1    May 25, 2006

(51) Int. Cl.
*H01L 21/8238* (2006.01)

(52) U.S. Cl. ............... 438/660; 438/513; 438/542; 438/663; 438/761; 438/778

(58) Field of Classification Search ........... 438/513, 438/542, 660, 663, 761, 778, FOR. 242, 438/FOR. 334, FOR. 407
See application file for complete search history.

(56) References Cited

U.S. PATENT DOCUMENTS

| | | | |
|---|---|---|---|
| 5,563,093 A | 10/1996 | Koda et al. ........... 437/101 |
| 5,597,754 A | 1/1997 | Lou et al. ............. 437/52 |
| 6,136,654 A | 10/2000 | Kraft et al. ........... 438/287 |
| 6,372,559 B1* | 4/2002 | Crowder et al. ....... 438/157 |
| 6,380,056 B1* | 4/2002 | Shue et al. ............ 438/591 |
| 6,610,614 B2 | 8/2003 | Niimi et al. ........... 438/775 |
| 6,610,615 B1 | 8/2003 | McFadden et al. ..... 438/776 |
| 6,649,538 B1* | 11/2003 | Cheng et al. .......... 438/775 |
| 6,939,756 B1* | 9/2005 | Chung et al. .......... 438/198 |
| 2002/0009900 A1 | 1/2002 | Tang et al. ............ 438/786 |
| 2004/0145029 A1 | 7/2004 | Adetutu ................ 257/639 |

OTHER PUBLICATIONS

"Nitrogen Engineering of Ultrathin Oxynitrides by a Thermal NO/02/NO Process," by, E.P Gusev et al., Jrnl. of Applied Physics, vol. 84, No. 5, Sep. 1, 1998, pp. 2980-2982.

"Optimization of Bimodal Nitrogen Concentration Profiled in Silicon Oxynitrides," b Sanjit Singh Dang et al., Jrnl. of Appl. Phys., vol. 86, No. 3, Aug. 1, 1999, pp. 1326-1330.

\* cited by examiner

*Primary Examiner*—George R. Fourson
*Assistant Examiner*—Joannie Adelle Garcia

(57) ABSTRACT

A method of forming a gate dielectric layer is disclosed. The method comprises the following steps. A substrate is provided having silicon regions containing surfaces upon which gate dielectrics are to be disposed. An oxide is formed over the surfaces. A silicon layer is formed over the oxide layer. A nitridation process is performed. An optional high temperature annealing step may be performed.

46 Claims, 1 Drawing Sheet

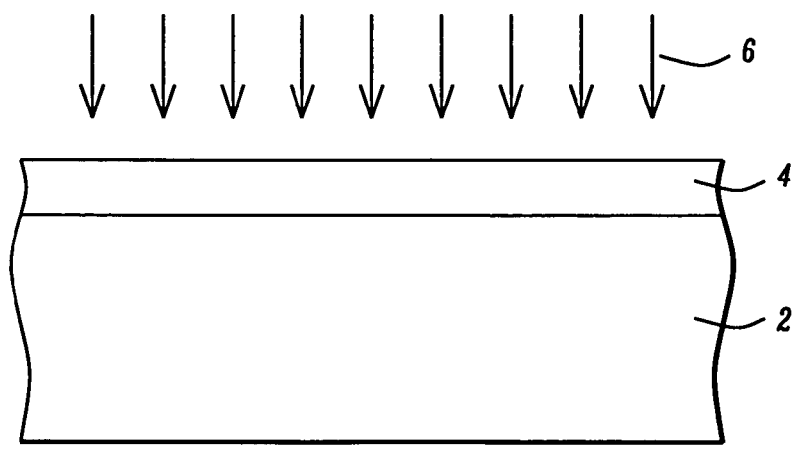
FIG. 1 - Prior Art
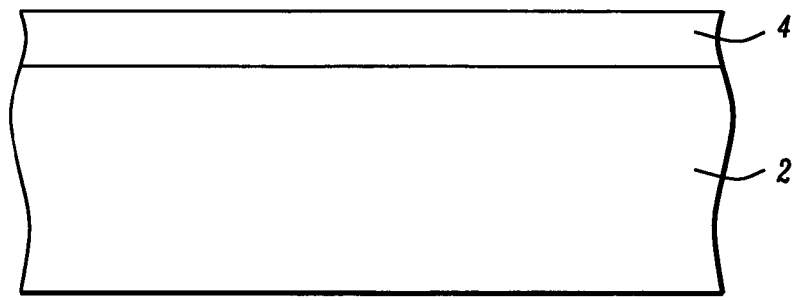
FIG. 2
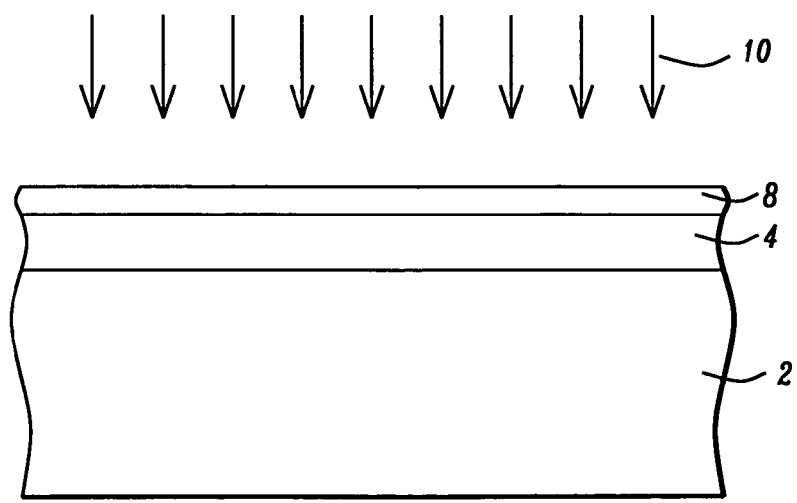
FIG. 3

METHOD OF FORMING ULTRA THIN SILICON OXYNITRIDE FOR GATE DIELECTRIC APPLICATIONS

BACKGROUND OF THE INVENTION (1) Field of the Invention

The present invention relates generally to semiconductor integrated circuit processing and more particularly to gate dielectric layers of MOSFET devices.

(2) Description of Prior Art

The gate dielectric is perhaps the most sensitive component of modern CMOS devices. Requirements of appropriate dielectric layers include high dielectric breakdown strength, good diffusion barrier properties, low trapping densities and low interfacial states. As device dimensions decrease there is a corresponding need for thinner gate dielectric layers. Generally, requirements become more stringent and new thinner gate dielectric structures are needed that meet the more stringent requirements.

Silicon oxynitride layers are used for gate dielectrics in various CMOS technologies and it is expected that their use will extend into the near future. To optimize the performance of silicon oxynitride layers, which are essentially gate oxide layers containing nitrogen, the amount and distribution of the nitrogen in the layers is of utmost importance. It is imperative to have a large concentration of nitrogen near the gate/dielectric interface to act as a penetration barrier. For instance, in PMOS a large concentration of nitrogen in the gate dielectric layer at the interface with the polysilicon gate is required to prevent boron penetration. Nitrogen is also required in the dielectric at the dielectric/silicon interface for increased resistance to hot carrier affects and for improved interface quality. At the dielectric/silicon interface however, the nitrogen concentration needs to be limited since too much nitrogen is detrimental, giving rise to decreased channel carrier mobility and degraded reliability. A bimodal nitrogen concentration profile in the dielectric would be ideal, with the highest concentration near the gate/dielectric interface, a lower but still high concentration near the dielectric/silicon interface and a moderate concentration in between. Preferred embodiments of the invention provide improved methods for achieving such a profile.

Tuning the nitrogen concentration formula to achieve improved performance is at times denoted Nitrogen profile engineering. Several approaches have been proposed. Gusev et al., J. Appl. Phys. 84, pages 2980–2982, 1998, present a method for tuning the nitrogen concentration profile utilizing thermal processing. Their approach involves using $NO/O_2/NO$ gasses sequentially. Dang and Takoudis, J. Appl. Phys. 86, pages 1326–1330, 1999, extended the method. They studied the affect on the nitrogen concentration profile of different process sequences using NO, $N_2O$ and $O_2$ gasses. The technique of Dang and Takoudis relies on the different thermal nitridation characteristics of the different nitrogen sources, i.e. NO and $N_2O$ gasses. These methods are limited, however, in that thermal nitridation is difficult to extend to the sub 1.6 nm EOT range and these methods cannot fine-tune the nitrogen concentration profile to achieve an optimized bimodal nitrogen concentration profile for such thin dielectric layers.

Other nitrogen profiling techniques utilize plasma nitridation. Kraft et al., U.S. Pat. No. 6,136,654, provide a plasma nitridation method for introducing non-uniform concentrations of nitrogen that is incorporated into an oxide layer or forms a nitride layer at the surface of the substrate. As pointed out by Nimi et al., U.S. Pat. No. 6,610,614, the method is not suitable for oxide layers less than about 2 nm thick. Nimi et al. also use plasma nitridation to introduce nitrogen into an oxide film but add re-oxidation and annealing steps to stabilize the nitrogen concentration profile, heal plasma induced damage and reduce interfacial defect densities. McFadden et al., U.S. Pat. No. 6,610,615 discloses a low power direct plasma method for introducing nitrogen into an oxide layer. Using a gas having lower ionization energy than nitrogen in combination with nitrogen results in a steeper concentration profile for nitrogen in the oxide layer. However, none of the above patents, McFadden et al., Kraft et al. or Nimi et al., provide a method to achieve an optimized bimodal nitrogen concentration profile for thin dielectric layers.

Shue et al., U.S. Pat. No. 6,380,056, disclose forming a silicon layer, exposing the silicon layer to nitrogen containing annealing atmosphere to form a silicon nitride layer, then oxidizing to form a silicon oxynitride layer. U.S. Pat. No. 5,563,093, to Koda et al., and U.S. Pat. No. 5,597,754, to Lou et al., teach methods of forming silicon gates utilizing $Si_2H_6$. U.S. Patent Application 2004/0145029 to Acetutu et al. shows a silicon oxynitride antireflective coating layer formed using $Si_2H_6$ or $Si_3H_8$, for example as silicon source. U.S. Patent Application 2002/0009900 to Tay et al. discloses a silicon oxynitride layer formed on silicon by rapid thermal processing.

Conventional process flows used to tune the nitrogen concentration profile in dielectric layers are shown in FIG. 1. Region 2 is a silicon region, which could be a silicon substrate or a silicon region formed on a substrate. An oxide layer, 4, is formed over the surface of the silicon region. Nitrogen is introduced through the surface of the oxide layer, 4, from nitrogen containing species, 6, in the atmosphere above the oxide layer. This can be done by thermal nitridation, which, as pointed out by Nimi et al., U.S. Pat. No. 6,610,614, seems to be unsuitable to modern ultra-thin oxide layers. In the case of thermal nitridation the nitrogen concentration profile tuning is accomplished by the choice of nitrogen sources, such as NO or $N_2O$, the process sequence, in which other gases, such as $O_2$, can be included, and the conditions of annealing steps. Plasma nitridation has been studied as an alternative to thermal nitridation, particularly as a method of introducing large concentrations of nitrogen localized in the oxide layer at the gate-dielectric interface. Tuning the nitrogen concentration profile by alteration of the plasma parameters has proven problematic, however, due to contradictory behavior in the nitridation process for different nitrogen containing species. For example, nitrogen ions in the plasma do not have high diffusivity, but usually have high kinetic energy. Nitrogen radicals, usually do not high kinetic energy, but have high diffusivity. Thus compromises have to be made in terms of the choice of plasma parameters to achieve nitrogen concentration profile tuning. Some improvements have been made in terms of plasma source control, such as, for instance, using pulsed RF sources and the addition of helium to the plasma, that improve the tenability. However there is still much room for improvement, for which it is a primary objective of the invention to provide.

SUMMARY OF THE INVENTION

It is a primary objective of the invention to provide a readily manufacturable process for fabricating an ultra thin gate dielectric. It is further a primary objective of this invention to provide an ultra thin gate dielectric with improved channel leakage and mobility, which is an excellent barrier to boron penetration and has improved reliability. It is yet a further primary objective of the invention to provide a method for fabricating a gate dielectric with a nitrogen concentration profile that is optimally tuned so that there results improved leakage, mobility, boron penetration and reliability characteristics. Yet another primary objective of the invention is to provide a method for tuning nitrogen concentration profiles in gate dielectric layers to obtain a bimodal nitrogen concentration profile, with a large nitrogen concentration peak near the gate/dielectric interface and a smaller peak near the dielectric/silicon interface, that results in improved leakage, mobility, barrier penetration and reliability characteristics.

In contrast to conventional processes, a thin silicon layer is formed over an oxide layer that had been formed over a silicon region. Upon nitridation most of the nitrogen will be concentrated within the thin silicon film, while some nitrogen will be situated near the oxide silicon interface. The invention thus provides a method of forming a bimodal nitrogen concentration profile with a large nitrogen concentration peak near the gate/dielectric interface and a smaller peak near the dielectric/silicon interface, that results in improved leakage, mobility, barrier penetration and reliability characteristics and therefore the objectives of the invention are achieved.

A method of forming a gate dielectric layer is disclosed. The method comprises the following steps. A substrate is provided having silicon regions containing surfaces upon which gate dielectrics are to be disposed. An oxide is formed over the surfaces. A silicon layer is formed over the oxide layer. A nitridation process is performed. An optional high temperature annealing step may be performed.

BRIEF DESCRIPTION OF THE DRAWINGS

In the accompanying drawing forming a material part of this description, there is shown:

FIG. 1 shows a conventional process.
FIGS. 2 and 3 show a process according to the invention.

DESCRIPTION OF THE PREFERRED EMBODIMENTS

FIGS. 2 and 3 illustrate process flows according to preferred embodiments of the invention. As in conventional process flows region 2 is a silicon region, which could be a silicon substrate or a silicon region formed on a substrate. An oxide layer, 4, is formed over the surface of the silicon region. For application in recent and future CMOS technologies the oxide layer thickness is in the vicinity of 10 Angstroms, the range being about 7 to about 15 Angstroms. This oxide, preferably, is grown by conventional thermal processes, of which the ISSG (in-situ steam generation) processes are particularly recommended. The oxide may have some nitride within it, about 0–5%, which had been incorporated using conventional methods, for example RTNO. The next step is crucial to the invention. As shown in FIG. 3, a thin silicon layer, 8, is formed over the oxide layer. Preferably the thickness of the silicon layer is between about 5 to about 15 Angstroms. Formation of the silicon layer can be accomplished using standard procedures that result in thin uniform layers. A preferred method is LPCVD using large molecule Si-containing sources, such as $Si_2H_6$, $Si_3H_8$, and $SiH_{10}$ etc. Also preferred is forming the silicon layer, 8, using a plasma source with Si-containing species, such as $SiH_4$. In using a plasma source, silicon atoms may be distributed in the near surface region of layer 4.

A nitridation step, which in conventional processes is usually performed over the oxide layer 4, is in preferred embodiments of the invention performed after the silicon layer 8 is formed. Since the silicon layer acts as a gettering region for nitrogen, which could be introduced either by annealing in a nitrogen-containing atmosphere or by nitrogen containing plasma, a high concentration of nitrogen is formed in the silicon layer. A smaller concentration of nitrogen will also be found near the interface of the oxide layer, 4 with the silicon region, 2. The large concentration of nitrogen that is needed near the gate/dielectric interface to act as a penetration barrier is thus formed. Nitrogen that is required in the dielectric at the dielectric/silicon interface for increased resistance to hot carrier affects and for improved interface quality is also formed and here the nitrogen concentration is limited since so that decreased channel carrier mobility and degraded reliability does not occur. The preferred bimodal nitrogen concentration profile with a very high concentration near the gate/dielectric interface and a lower but still high concentration near the dielectric/silicon interface is thus achieved by the preferred embodiments of the invention.

There are two options for the nitridation processes. Nitridation could be accomplished using N-containing plasma. Nitridation could also be accomplished by annealing in a NO-containing atmosphere.

For the case of annealing in a NO-containing atmosphere the annealing gasses that provide the nitrogen could be $N_2O$, NO, $NH_3/O_2$ or $N_2/O_2$ or combinations. The annealing conditions, corresponding to any of the gasses, depend on the thickness of the silicon layer, 8. For annealing gasses $N_2/NO/O_2$, annealing temperatures between about 900° C. and about 1100° C. for durations up to about 15 seconds are appropriate for silicon layers between about 5 to 15 Angstroms. A single silicon oxynitride layer results with a bimodal nitrogen distribution. High nitrogen concentrations are formed near the surface as a consequence of the tendency of silicon to getter nitrogen and a smaller peak forms at the interface with the silicon region 2. Tuning of the nitrogen concentration distribution can be achieved by varying annealing conditions and the thickness of the silicon layer 8.

Nitridation could also be accomplished using N-containing plasma. This option would have the advantage that it would be efficient to combine nitrogen plasma nitridation with silicon plasma processing for forming the silicon layer. For the case of N-containing plasmas the source that provides the nitrogen could be $N_2$ and included in the gas should be Silicon containing sources such as $SiH_4$. Plasma conditions such as pressure, power and duration need to be adjusted to achieve a particular nitrogen concentration profile, which depends also on the thickness of the silicon layer, 8. Higher nitrogen concentrations near the surface are attained for thicker silicon layers and for higher power. For plasma sources $N_2$ and $SiH_4$, temperatures from about 20° C. to about 300° C. are appropriate. A single silicon oxynitride layer results with a bimodal nitrogen distribution. High nitrogen concentrations are formed near the surface as a consequence of the tendency of silicon to getter nitrogen and a smaller peak forms at the interface with the silicon region 2.

An optional high temperature annealing step can now be performed, at a temperature of about 1000° C. and for duration of about 0–15 sec. This annealing step serves to repair any damage that could have occurred in the prior processing and to improve gate dielectric quality.

While the invention has been particularly shown and described with reference to the preferred embodiments thereof, it will be understood by those skilled in the art that various changes in form and detail may be made without departing from the spirit and scope of the invention.

What is claimed is:

1. A method of forming a gate dielectric layer comprising:
providing a substrate having silicon regions that contain surfaces upon which gate dielectrics are to be disposed wherein said silicon regions are silicon N-wells and/or P-wells formed in silicon regions;
forming an oxide layer over the surface of said silicon regions;
forming a silicon layer over said oxide layer;
annealing said substrate in a nitrogen containing environment to introduce nitrogen into said silicon layer and said oxide layer wherein said annealing in a nitrogen atmosphere is accomplished by using $N_2O$, $NO$, $NH_3/O_2$ or $N_2/O_2$ as nitrogen sources.

2. The method of claim 1 wherein said substrate is a silicon substrate.

3. The method of claim 1 wherein said silicon regions are regions of a silicon substrate.

4. The method of claim 1 wherein said oxide layer is a thermally grown oxide layer.

5. The method of claim 1 wherein said deposited dielectric layer is an ISSG oxide layer.

6. The method of claim 1 wherein the thickness of said oxide layer is between about 7 to about 15 Angstroms.

7. The method of claim 1 wherein said silicon layer is formed by a LPCVD process.

8. The method of claim 1 wherein said silicon layer is formed by a LPCVD process using big molecular sources.

9. The method of claim 1 wherein said silicon layer is formed by a plasma source with silicon containing species.

10. The method of claim 1 wherein said silicon layer is formed by a plasma source with silicon containing species in which hydrogen is absent.

11. The method of claim 1 wherein the duration of said annealing in a nitrogen atmosphere is between about 0 to about 15 seconds.

12. The method of claim 1 wherein the temperature of said annealing in a nitrogen atmosphere is between about 900 to about 1100° C.

13. A method of forming a gate dielectric layer comprising:
providing a substrate having silicon regions that contain surfaces upon which gate dielectrics are to be disposed wherein said silicon regions are silicon N-wells and/or P-wells formed in silicon regions;
forming an oxide layer over the surface of said silicon regions;
forming a silicon layer over said oxide layer;
annealing said substrate in a nitrogen containing environment to introduce nitrogen into said silicon layer and said oxide wherein said annealing in a nitrogen atmosphere is accomplished by using $N_2O$, $NO$, $NH_3/O_2$ or $N_2/O_2$ as nitrogen sources; and
performing a high temperature anneal.

14. The method of claim 13 wherein said substrate is a silicon substrate.

15. The method of claim 13 wherein said silicon regions are regions of a silicon substrate.

16. The method of claim 13 wherein said oxide layer is a thermally grown oxide layer.

17. The method of claim 13 wherein said deposited dielectric layer is an ISSG oxide layer.

18. The method of claim 13 wherein the thickness of said oxide layer is between about 7 to about 15 Angstroms.

19. The method of claim 13 wherein said silicon layer is formed by a LPCVD process.

20. The method of claim 13 wherein said silicon layer is formed by a LPCVD process using big molecular sources.

21. The method of claim 13 wherein said silicon layer is formed by a plasma source with silicon containing species.

22. The method of claim 13 wherein said silicon layer is formed by a plasma source with silicon containing species in which hydrogen is absent.

23. The method of claim 13 wherein the duration of said annealing in a nitrogen atmosphere is between about 0 to about 15 seconds.

24. The method of claim 13 wherein the temperature of said annealing in a nitrogen atmosphere is between about 900 to about 1100° C.

25. The method of claim 13 wherein said high temperature anneal is performed at a temperature of about 1000° C.

26. A method of forming a gate dielectric layer comprising:
providing a substrate having silicon regions that contain surfaces upon which gate dielectrics are to be disposed wherein said silicon regions are silicon N-wells and/or P-wells formed in silicon regions;
forming an oxide layer over the surface of said silicon regions;
forming a silicon layer over said oxide layer;
using an N-containing plasma to introduce nitrogen into said silicon layer and said oxide wherein said N-containing plasma uses $N_2O$, $NO$, $NH_3$ or $N_2$ as nitrogen sources.

27. The method of claim 26 wherein said substrate is a silicon substrate.

28. The method of claim 26 wherein said silicon regions are regions of a silicon substrate.

29. The method of claim 26 wherein said oxide layer is a thermally grown oxide layer.

30. The method of claim 26 wherein said deposited dielectric layer is an ISSG oxide layer.

31. The method of claim 26 wherein the thickness of said oxide layer is between about 7 to about 15 Angstroms.

32. The method of claim 26 wherein said silicon layer is formed by a LPCVD process.

33. The method of claim 26 wherein said silicon layer is formed by a LPCVD process using big molecular sources.

34. The method of claim 26 wherein said silicon layer is formed by a plasma source with silicon containing species.

35. The method of claim 26 wherein said silicon layer is formed by a plasma source with silicon containing species in which hydrogen is absent.

36. A method of forming a gate dielectric layer comprising:
providing a substrate having silicon regions that contain surfaces upon which gate dielectrics are to be disposed wherein said silicon regions are silicon N-wells and/or P-wells formed in silicon regions;
forming an oxide layer over the surface of said silicon regions;
forming a silicon layer over said oxide layer;
using an N-containing plasma to introduce nitrogen into said silicon layer and said oxide wherein said N-containing plasma uses $N_2O$, $NO$, $NH_3$ or $N_2$ as nitrogen sources;
performing a high temperature anneal.

37. The method of claim 36 wherein said substrate is a silicon substrate.

38. The method of claim 36 wherein said silicon regions are regions of a silicon substrate.

39. The method of claim 36 wherein said oxide layer is a thermally grown oxide layer.

40. The method of claim 36 wherein said deposited dielectric layer is an ISSG oxide layer.

41. The method of claim 36 wherein the thickness of said oxide layer is between about 7 to about 15 Angstroms.

42. The method of claim 36 wherein said silicon layer is formed by a LPCVD process.

43. The method of claim 36 wherein said silicon layer is formed by a LPCVD process using big molecular sources.

44. The method of claim 36 wherein said silicon layer is formed by a plasma source with silicon containing species.

45. The method of claim 36 wherein said silicon layer is formed by a plasma source with silicon containing species in which hydrogen is absent.

46. The method of claim 36 wherein said high temperature anneal is performed at a temperature of about 1000 ° C.

* * * * *